(12) United States Patent
Cao et al.

(10) Patent No.: US 8,643,990 B2
(45) Date of Patent: Feb. 4, 2014

(54) PROTECTION CIRCUIT (75) Inventors: Yiqun Cao, Munich (DE); Herbert Gietler, Villach (AT); Ulrich Glaser, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 313 days.

(21) Appl. No.: 13/112,659

(22) Filed: May 20, 2011

(65) Prior Publication Data
US 2011/0304940 A1 Dec. 15, 2011

(51) Int. Cl.
*H02H 3/20* (2006.01)
*H02H 9/04* (2006.01)

(52) U.S. Cl.
USPC ........... 361/91.1; 361/56; 361/91.2; 361/91.5

(58) Field of Classification Search
USPC .......................... 361/56, 111, 91.1, 91.2, 91.5
See application file for complete search history.

(56) References Cited

U.S. PATENT DOCUMENTS

| | | | |
|---|---|---|---|
| 5,463,520 A * | 10/1995 | Nelson | 361/56 |
| 5,500,546 A | 3/1996 | Marum et al. | |
| 5,978,192 A * | 11/1999 | Young et al. | 361/56 |
| 6,958,896 B2 | 10/2005 | Lin et al. | |
| 7,079,369 B2 | 7/2006 | Hulfachor et al. | |
| 7,411,770 B2 | 8/2008 | Logiudice et al. | |
| 7,768,753 B2 * | 8/2010 | Fankhauser et al. | 361/56 |
| 2007/0103830 A1 | 5/2007 | Logiudice et al. | |
| 2008/0002324 A1 | 1/2008 | Logiudice et al. | |

FOREIGN PATENT DOCUMENTS

| | | |
|---|---|---|
| DE | 102 97 094 T5 | 8/2004 |
| EP | 1 873 917 A1 | 1/2008 |
| EP | 1 783 909 B1 | 5/2008 |

OTHER PUBLICATIONS

Mergens, M. P. J., et al., "ESD Protection Considerations in Advanced High-Voltage Technologies for Automotive," EOS/ESD Symposium, 2006, pp. 2A.1-1 to 2A.1-10.

* cited by examiner

*Primary Examiner* — Rexford Barnie
*Assistant Examiner* — Zeev V Kitov
(74) *Attorney, Agent, or Firm* — Slater & Matsil, L.L.P.

(57) ABSTRACT

A protection circuit includes a controllable discharge element having a load path coupled between a first second circuit nodes. The discharge element provides a discharge path between the first and the second circuit nodes when in an on state. A trigger circuit has a first connection coupled to the first circuit node and a second connections coupled to the second circuit node. The trigger circuit is configured to produce a drive signal that switches the discharge element to its on state when the voltage between the first and the second circuit nodes reaches a trigger value. A setting circuit coupled to the trigger circuit is configured to change the trigger value from a first trigger value to a second trigger value depending on a voltage between the first and the second circuit nodes and/or on the drive signal.

25 Claims, 8 Drawing Sheets

PROTECTION CIRCUIT

This application claims priority to German Patent Application 10 2010 030 064.0, which was filed Jun. 15, 2010 and is incorporated herein by reference.

TECHNICAL FIELD

The present invention relates to a protection circuit, in particular an overvoltage protection circuit, such as an ESD protection circuit.

BACKGROUND

Voltage peaks or voltage pulses, for example voltage pulses which result from an electrostatic discharge (ESD) or an electrical overstress (EOS), can lead to damage or to reliability problems in semiconductor components or in integrated circuits (ICs) which comprise a plurality of semiconductor components. Voltage peaks may be caused by electrical charge, such as an electrical charge which results from an ESD event. In the case of an ESD event such as this, electrical charge is transmitted in a short time from an object, such as a person or a transmission line, to a circuit node, to which the semiconductor component or the IC is connected. The voltage peak can damage or destroy the semiconductor component or the IC. Damage which occurs as a result of such voltage peaks includes, for example: the interruption of a line connection as a result of the line connection melting, or the destruction or degradation of a gate oxide of a semiconductor component, which is in the form of a MOSFET or IGBT.

Various concepts for overvoltage protection, in particular for ESD protection, are described, for example, in Mergens et al.: "ESD-Protection Considerations in Advanced High-Voltage Technologies for Automotive", Proceedings of the EOS/ESD Symposium 2006, pages 2A.1-1 to 2A.1-10.

A first known concept provides for a diode which is biased in the reverse direction to be connected in parallel with the semiconductor component to be protected. When a voltage pulse occurs, whose amplitude is higher than the breakdown voltage of the diode, the diode breaks down and dissipates the electrical charge causing the voltage pulse, thus protecting the semiconductor component. However, diodes require a comparatively large semiconductor area.

According to a further known concept, a protection circuit comprises a discharge element, such as a transistor, which is connected in parallel with the semiconductor component to be protected. The protection circuit furthermore comprises a trigger circuit, which triggers the discharge element when a voltage peak is detected whose amplitude is greater than a predetermined threshold voltage. By way of example, a protection circuit such as this is described in U.S. Pat. No. 7,079,369 B2.

Furthermore, so-called GGMOS protection circuits are known (GGMOS=Grounded Gate MOS). Circuits such as these comprise a MOSFET whose drain-source path is connected in parallel with a semiconductor component to be protected, and whose gate is connected to ground or a reference potential. This MOSFET changes to avalanche operation when the voltage across its drain-source path exceeds its avalanche breakdown voltage. The MOSFET therefore prevents any further rise in the voltage across the semiconductor component to be protected. When the MOSFET changes to avalanche operation, a parasitic bipolar transistor is switched on, formed by the drain, source and body regions of the MOSFET. When this parasitic bipolar transistor is switched on, the MOSFET changes to a low-impedance state, the so-called snapback state. In the snapback state, the voltage across the drain-source path is reduced to the value of a holding voltage, which is below the breakdown voltage. In the snapback state, the MOSFET dissipates electrical charge in a very efficient manner. The holding voltage is, however, dependent on the respective design of the MOSFET and the doping concentration of the drain, source and body regions of the MOSFET.

By way of example, further ESD protection circuits are described in U.S. Pat. No. 5,500,546, U.S. Pat. No. 6,958,896 B2, U.S. Pat. No. 7,079,369 B2 and DE 10 297 094 T5. By way of example, overvoltage protection circuits are described in EP 1 783 909 B1 and EP 1 873 917 A1.

SUMMARY OF THE INVENTION

In various embodiments, the present invention provides an efficient protection circuit, in particular, an ESD protection circuit.

A first aspect of the present invention relates to a protection circuit having a controllable discharge element, which has a load path which is connected between a first and a second circuit node and is designed to assume an on state or an off state. In the on state, the discharge element provides a discharge path between the first and the second circuit nodes. The protection circuit furthermore comprises a trigger circuit with first and second connections, which are connected between the first and the second circuit nodes and are designed to produce a drive signal which switches the discharge element to its on state when the voltage between the first and the second circuit nodes reaches a trigger value. A setting circuit is coupled to the trigger circuit and is designed to change the trigger value from a first trigger value to a second trigger value, depending on a voltage between the first and the second circuit nodes or depending on the drive signal. In this case, the second trigger value is lower than the first trigger value.

In this protection circuit, a protection circuit snapback response can be set via the first and the second trigger values of the trigger circuit. If the trigger value is reduced from the first trigger value to the second trigger value, this makes it possible to achieve faster and more reliable charge equalization between the first and the second circuit nodes. In this case, the trigger value may be reduced depending on the voltage between the first and the second circuit nodes or depending on the drive signal. The trigger value can be reduced by reducing the trigger value only when the discharge element is already in the on state. Reducing the trigger value ensures that the discharge element remains switched on even when the voltage between the first and the second circuit nodes falls.

The protection circuit is suitable for protection of any desired electronic components, in particular of semiconductor components, or of any desired circuits, in particular of integrated circuits having a plurality of components, in which the component to be protected or the circuit to be protected can be connected between the first and the second circuit nodes of the protection circuit.

A further aspect of the invention relates to a protection circuit having a controllable discharge element, which has a load path which is connected between a first and a second switching node and is designed to assume an on state or an off state. In the on state, the discharge element in this case provides a discharge path between the first and the second circuit nodes. The protection circuit furthermore comprises a trigger circuit having first and second connections, which are connected between the first and the second circuit nodes and are designed to produce a drive signal which switches the discharge element to the on state when a voltage between the first and the second circuit nodes reaches a trigger value. The trigger circuit comprises a detector circuit, which is connected between the first and the second circuit nodes and is designed to produce a trigger signal depending on a voltage between the first and the second circuit nodes. The detector circuit comprises a zener circuit with at least one zener diode. The trigger circuit furthermore comprises an amplifier, which is connected between the detector circuit and the discharge element, with the trigger signal being supplied to the amplifier, and with the amplifier producing the drive signal depending on the trigger signal.

In this protection circuit, the amplifier ensures that, even in the case of voltages between the first and the second circuit nodes which are only slightly above the trigger value, the discharge element is operated to such an extent that efficient and reliable charge equalization is achieved between the first and the second circuit nodes.

BRIEF DESCRIPTION OF THE DRAWINGS

Examples of the present invention will be explained in the following text with reference to drawings. The drawings are intended to explain the basic principle of the invention, as a result of which only those features which are required for understanding of the basic principle are illustrated. The drawings are not necessarily to scale. Unless stated to the contrary, the same reference symbols in the drawings denote the same features and signals with the same meaning.

DETAILED DESCRIPTION OF ILLUSTRATIVE EMBODIMENTS

Figure 1:
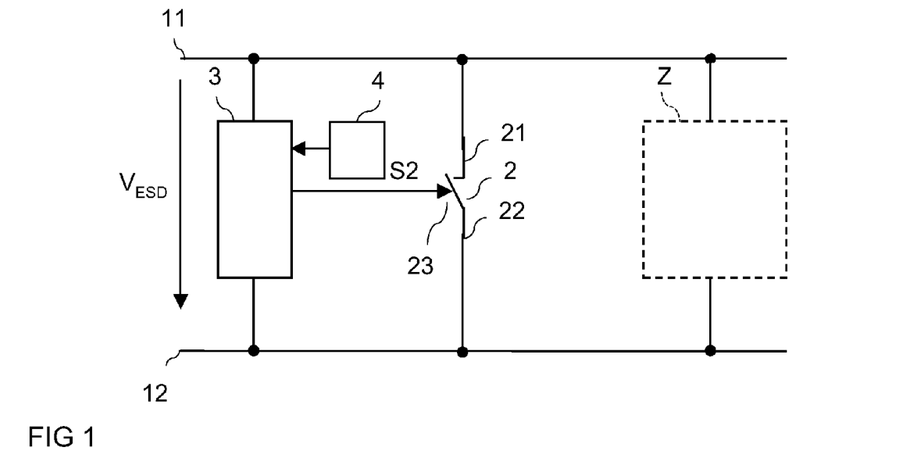
FIG. 1 schematically illustrates a protection circuit according to a first exemplary embodiment, which has a discharge element, a trigger circuit and a setting circuit coupled to the trigger circuit.

FIG. 1 schematically illustrates a first exemplary embodiment of a protection circuit for protection of a semiconductor component, or of an integrated circuit, against overvoltages, in particular against those overvoltages which result from electrostatic discharges (ESD).

The protection circuit has a first and a second circuit node 11, 12, between which a component to be protected or a circuit to be protected can be protected. The term "circuit to be protected" is used equally in the following text for a circuit having a plurality of circuit components or having only one circuit component. One such circuit is illustrated by dashed lines in FIG. 1, and is annotated with the reference symbol Z. A circuit to be protected may have a multiplicity of connections. In this case, the connections of the circuit to be protected can be connected between the first and the second circuit nodes 11, 12, between which a circuit path, which is sensitive to overvoltages, in said circuit is located. If the component in a circuit to be protected is a MOSFET or IGBT, its gate-source path, for example, is a path which is sensitive to such overvoltages. By way of example, in order to protect a component such as this against overvoltages by means of the protection circuit according to the invention, its gate-source path can be connected between the first and the second circuit nodes 11, 12.

With reference to FIG. 1, the protection circuit comprises a discharge element 2 having a load path which runs between a first and a second load path connections 21, 22, and having a controlled connection 23. The load path of the discharge element is connected via the load path connections 21, 22 between the first and the second circuit nodes 11, 12. The discharge element 2 can assume an on state and an off state, with the discharge element 2, when in the on state, providing a discharge path between the first and the second circuit nodes 11, 12. This is equivalent to saying that the discharge element 2 allows current to flow between the first and the second circuit nodes 11, 12 when it is in the on state. In the off state, the discharge element 2 prevents a current flow between the first and the second circuit nodes 11, 12.

The discharge element 2 is driven by a drive signal S2, which is supplied to its drive connection 23. The discharge element 2 assumes its on state or its off state depending on this drive signal S2.

In particular, the discharge element 2 is designed such that its switched-on resistance in the on state is dependent on the drive signal S2. The switched-on resistance of the discharge element 2 is its electrical resistance between the first and the second load path connections 21, 22. The lower this switched-on resistance is, the faster and more efficiently a charge equalization which may be required can take place between the first and the second circuit nodes 11, 12. The discharge element 2 is illustrated schematically as a switch in FIG. 1. In this context, it should be noted that the discharge element 2 may be implemented in various ways which are still to be explained in the following text.

In order to produce the drive signal S2, the protection circuit has a trigger circuit 3, which is connected between the first and the second circuit nodes 11, 12. The trigger circuit 3 produces the drive signal S2 depending on a voltage $V_{ESD}$ between the first and the second circuit nodes 11, 12, and drives the discharge element 2 via this drive signal S2 such that the discharge element 2 assumes its on state when this voltage $V_{ESD}$ assumes a trigger value, or exceeds this. This trigger value is variable in the case of the trigger circuit 3 illustrated in FIG. 1, and is set by a setting circuit 4 depending on the voltage between the first and the second circuit nodes 11, 12 and/or depending on the drive signal S2, to be precise that the trigger value is reduced from a first trigger value, to a second trigger value which is lower than the first trigger value, depending on the voltage between the first and the second circuit nodes 11, 12 and/or depending on the drive signal S2.

Figure 2:
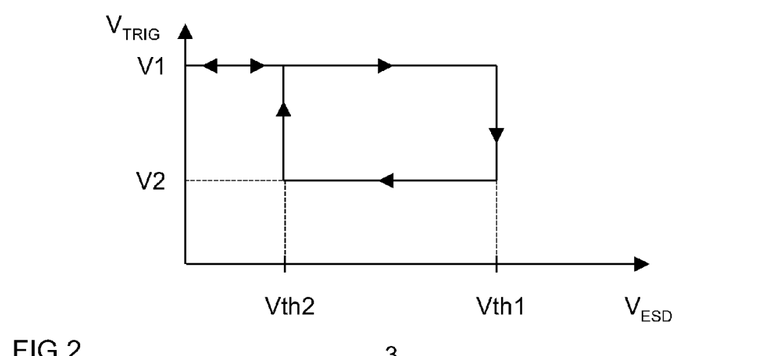
FIG. 2 illustrates the method of operation of the protection circuit shown in FIG. 1, on the basis of a voltage diagram.

One example provides for the setting circuit 4 to reduce the trigger value from the first trigger value to the second trigger value, which is lower than the first trigger value, when the voltage $V_{ESD}$ between the first and the second circuit nodes 11, 12 exceeds a voltage threshold value. FIG. 2 schematically illustrates the "trigger characteristic" of the protection circuit illustrated in FIG. 1 for this situation.

FIG. 2 illustrates the trigger value $V_{TRIG}$ depending on the voltage $V_{ESD}$ between the first and the second circuit nodes 11, 12. With reference to FIG. 2, the trigger value $V_{TRIG}$ corresponds to a first trigger value V1 when the voltage $V_{ESD}$ is zero. When this voltage $V_{ESD}$ rises, then the trigger value first of all remains at the first value V1, to be precise until the voltage $V_{ESD}$ reaches the threshold value Vth1. On reaching the threshold value Vth1, the trigger value $V_{TRIG}$ falls from the first trigger value V1 to the lower, second trigger value V2, where it remains until the voltage $V_{ESD}$ has fallen below a lower threshold value Vth2. Because of the change in the trigger value from the first trigger value V1 to the second trigger value V2 on reaching the upper threshold value Vth1, the trigger characteristic has hysteresis. This hysteresis or the change in the trigger value from the first value V1 to the second value V2 on exceeding the first threshold value Vth1 has two effects:

1) Charge equalization takes place via the discharge element 2 until the voltage $V_{ESD}$ between the first and the second circuit nodes 11, 12 has decreased to the lower, second threshold value V2;

2) When producing the drive signal S2 such that its amplitude is dependent on the voltage $V_{ESD}$ between the first and the second circuit nodes 11, 12, and when using a discharge element 2 whose switched-on resistance in the on state is dependent on the drive signal S2, the discharge element 2 is driven to have a low impedance after switching from the first upper trigger value V1 to the second lower trigger value V2, as a result of which charge equalization takes place more efficiently between the first and the second circuit nodes 11, 12.

Figure 3:
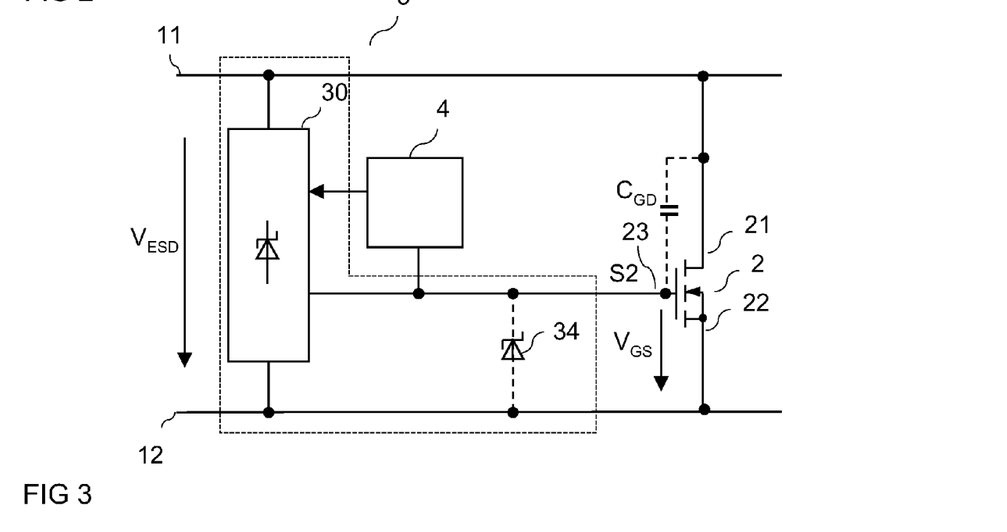
FIG. 3 schematically illustrates a protection circuit as shown in FIG. 1, in which the trigger circuit has a zener circuit.

FIG. 3 shows one example of a protection circuit in which the discharge element 2 is in the form of a MOS transistor, specifically a MOSFET. The MOSFET has a drain connection D and a source connection S, which respectively form the first and the second load path connections 21, 22. A gate connection G of the MOSFET forms the drive connection 23. The MOSFET as illustrated in FIG. 3 is an n-channel MOSFET. A p-channel MOSFET, an IGBT or a bipolar transistor may, of course, also be used as the discharge element 2, instead of an n-channel MOSFET. A MOSFET is a voltage-controlled component which is switched on depending on its gate-source voltage $V_{GS}$, that is to say the voltage between the gate connection G and the source connection S, that is to say it assumes an on state, or is switched off, that is to say it assumes an off state. The MOSFET is switched off when the gate-source voltage $V_{GS}$ is below a threshold value, the so-called threshold voltage, and is switched on when the gate-source voltage is above the threshold value, with the switched-on resistance of the MOSFET decreasing as the gate-source voltage increases for a specific value range of the gate-source voltage, the so-called linear range. In the circuit illustrated in FIG. 3, the drive signal S2 produced by the trigger circuit 3 corresponds to the gate-source voltage.

In the protection circuit illustrated in FIG. 3, the trigger circuit 3 has a zener circuit 30 which is connected between the first and the second circuit nodes 11, 12 and has at least one zener diode. The trigger circuit 3 optionally has a protection element 34 which is connected to the drive connection 23 of the discharge element 2. In the illustrated example, this protection element 34 is in the form of a zener diode, which is connected between the gate connection G and the source connection S of the discharge MOSFET 2 and prevents the drive voltage or the gate-source voltage of the MOSFET from rising above a threshold value which is defined by the breakdown voltage of the zener diode 34. A plurality of zener diodes connected in series may, of course, also be provided as the protection element 34, in which case the threshold value to which the drive voltage is limited increases as the number of series-connected zener diodes increases. If no gate-source protection is required for the discharge MOSFET 2, the circuit can be implemented without a zener diode 34.

With reference to FIG. 3, the setting circuit 4 can be implemented such that it produces the trigger value for the detector circuit depending on the drive signal S2. This is illustrated schematically in FIG. 3 by the drive signal S2 being supplied to the setting circuit 4.

Figure 4:
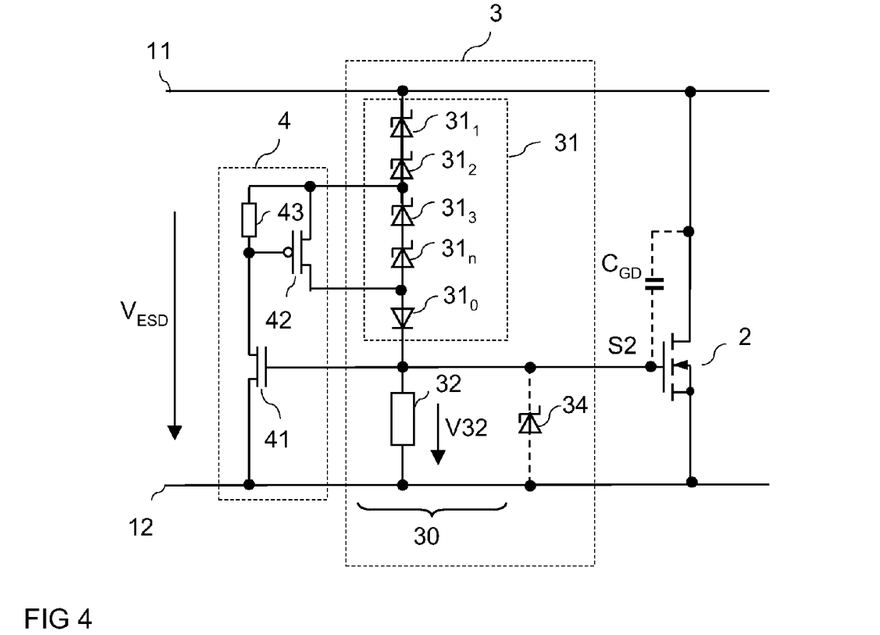
FIG. 4 illustrates a first exemplary embodiment of the protection circuit shown in FIG. 3.

FIG. 4 shows a first exemplary embodiment of the protection circuit illustrated in FIG. 3. In this example, the detector circuit comprises a series circuit with a zener circuit 31 and a detector element 32, which series circuit is connected between the first and the second circuit nodes 11, 12. In the illustrated example, the detector element 32 is in the form of a resistance element, specifically a non-reactive resistance. The zener circuit 31 comprises a series circuit with a plurality of zener diodes $31_1$-$31_n$ which are each connected in the reverse-biased direction between the first and the second circuit nodes 11, 12. In the illustrated example, the zener circuit 31 comprises four series-connected zener diodes $31_1$-$31_n$. However, this should be understood to be only an example. Depending on the maximum voltage difference which is intended to be permitted between the first and the second circuit nodes 11, 12, the number of zener diodes in the zener circuit 31 can be chosen as required. The zener circuit 31 may also comprise at least one diode $31_0$, which is connected back-to-back in series with the zener diodes $31_1$-$31_n$, in which case a series circuit with a plurality of such diodes may also be provided. This diode $31_0$ may have two functions: Firstly, it can be used for relatively fine adjustment of the trigger voltage, in that the forward-biased voltage of the at least one diode $31_0$ must be overcome in addition to the reverse-biased voltages of the zener diodes; secondly, when the discharge MOSFET 2 is switched on, the diode $31_0$ prevents the gate of this discharge MOSFET 2 from being discharged via the zener diode chain $31_1$-$31_n$ during the transient voltage flank.

The detector element 32, which is connected in series with the zener circuit 31, produces a signal which is used as the drive signal S2 for driving the discharge MOSFET 2, or is derived from the drive signal S2. In the example illustrated in FIG. 4, in which the detector element 32 is a resistance element, the drive signal S2 corresponds to a voltage V32 across the resistance element 32, which is connected in series with the zener circuit 31.

In order to set the trigger value, the setting circuit 4 has a bridging circuit which is designed to bridge at least one of the zener diodes—in the illustrated example two zener diodes, specifically the zener diodes $31_3$ and $31_n$. In the setting circuit 4 illustrated in FIG. 4, the zener diodes $31_3$, $31_n$ are bridged depending on the drive signal S2, which in this example is dependent directly and primarily on the voltage $V_{ESD}$ between the first and the second circuit nodes. In the illustrated example, the bridging circuit is in the form of a transistor 42, whose load path (drain-source path) is connected in parallel with the zener diodes $31_3$, $31_n$ to be bridged, and which is switched on or off depending on the drive signal S2. The transistor 42 in the bridging circuit is in the form of a p-MOSFET in the illustrated example. In order to drive it, the setting circuit 4 has a further MOSFET 41—in the illustrated example an n-MOSFET—which is driven by the drive signal S2 and whose load path (drain-source path) is connected in series with a resistance 43, which is between the gate and source of the bridging transistor 42.

The method of operation of the protection circuit illustrated in FIG. 4 will be explained in the following text: In the illustrated protection circuit, when the voltage $V_{ESD}$ between the first and the second circuit nodes 11, 12 rises to a value which is greater than the sum of the breakdown voltages of the zener diodes $31_1$-$31_n$ and the forward-biased voltage of the diode $31_0$, then a current flows via the detector circuit 3 from the first circuit node 11 to the second circuit node 12. When the voltage between the first and the second circuit nodes 11, 12 rises further, such that the voltage drop across the resistance element 32 reaches the value of the threshold voltage of the discharge MOSFET 2, then the discharge MOSFET 2 changes to its on state, as a result of which charge equalization can take place between the first and the second circuit nodes 11, 12 via the load path of the discharge MOSFET. In this context, it should be noted that the voltage $V_{ESD}$ between the first and the second circuit nodes 11, 12 can also rise even further if the discharge element 2 has already been switched on. This is the situation when, for example, more electrical charge flows to the first circuit node 11, for example as a result of an electrostatic discharge process, than can be dissipated at the same time via the discharge element 2 to the second circuit node 12.

In the circuit illustrated in FIG. 4, the first trigger value V1 corresponds to the sum of the breakdown voltages of the zener diodes $31_1$-$31_n$, the forward-biased voltage of the diode $31_0$ and the threshold voltage of the discharge MOSFET 2. The drive signal S2 for the discharge MOSFET 2 also drives the transistor 41 in the setting circuit 4. When the drive signal S2 reaches the threshold voltage of this transistor 41, whose threshold voltage may correspond to the threshold voltage of the discharge MOSFET 2, then the transistor 41 switches on the bridging transistor 42, thus bridging two of the zener diodes $31_3$, $31_n$. This reduces the trigger value by the sum of the breakdown voltages of the two zener diodes $31_3$, $31_n$ (ignoring the voltage drop across the switched-on transistor 41) to the second trigger value. In the illustrated example, the second trigger value corresponds to the sum of the breakdown voltages of the zener diodes $31_1$, $31_2$, the forward-biased voltage of the diode $31_0$ and the threshold voltage of the discharge MOSFET 2. The reduction in the trigger voltage to the second trigger value has two effects:

1) When some of the zener diodes are bridged, the voltage drop across the resistance element 32, and therefore the drive signal S2, rise suddenly, thus opening up the discharge MOSFET further, with the impedance thus decreasing. The discharge MOSFET 2 therefore presents a lower-impedance discharge path between the first and the second circuit nodes 11, 12.

2) Furthermore, because of the reduction in the trigger value, a discharge process takes place between the first and the second circuit nodes 11, 12 until the voltage $V_{ESD}$ between the first and the second circuit nodes 11, 12 has fallen below the second trigger value V2. This trigger value V2 is chosen such that a circuit to be protected withstands this voltage.

The threshold value Vth1 of the voltage $V_{ESD}$, at which the trigger voltage $V_{TRIG}$ is switched between the first and the second trigger values V1, V2, corresponds, in the circuit illustrated in FIG. 4, to the voltage at which the transistor 41 in the setting circuit 4 is switched on. If the discharge MOSFET 2 and the drive transistor 41 in the setting circuit 4 have the same threshold voltages, the threshold value Vth1 corresponds to the first trigger value V1.

Switching the trigger voltage from the first trigger value to the second trigger value gives the protection circuit according to the invention a defined snapback response, which can be set by selection of the number of series-connected zener diodes and by the number of the zener diodes to be bridged by the setting circuit 4. In this context, it should be noted that the number n of series-connected zener diodes $31_1$-$31_n$ may be chosen as required, to be precise depending on the maximum permissible voltage between the first and the second circuit nodes, and that a number k, where k≤n, of the zener diodes to be bridged can likewise be chosen as required, to be precise depending on the desired snapback response.

Figure 5:
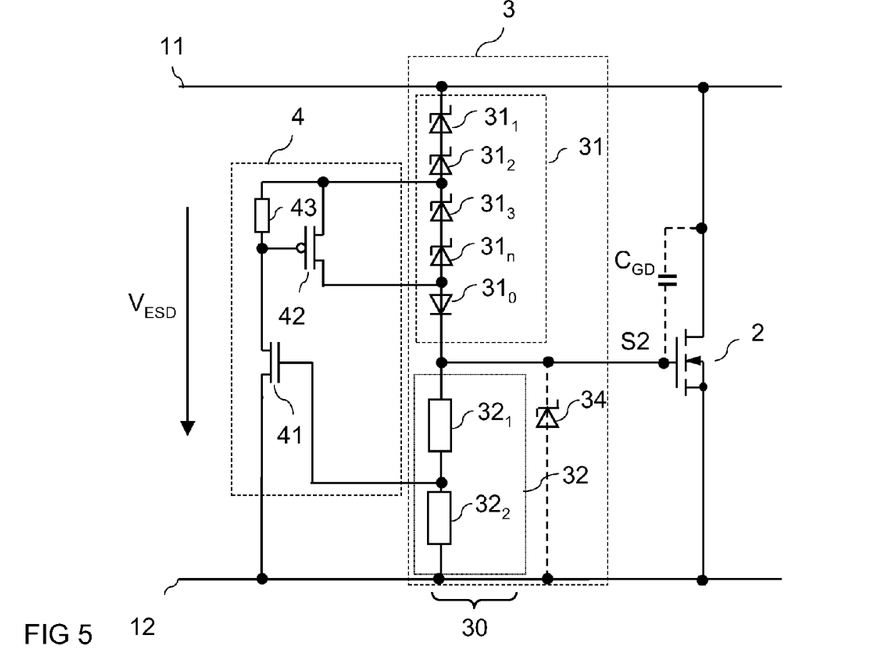
FIG. 5 illustrates a second exemplary embodiment of the protection circuit shown in FIG. 3.

FIG. 5 shows a further exemplary embodiment of the protection circuit shown in FIG. 3. The protection circuit illustrated in FIG. 5 differs from that illustrated in FIG. 4 in that the threshold value Vth1 of the voltage $V_{ESD}$, at which switching takes place from the first trigger value V1 to the second trigger value V2, is above the threshold value Vth1 of the circuit in FIG. 4. In the circuit illustrated in FIG. 5, this is achieved by the detector element 32 being in the form of a voltage divider with a first and a second voltage divider resistance $32_1$, $32_2$, and a center tap between the first and the second voltage divider resistances $32_1$, $32_2$. The drive signal S2 in this case corresponds to the voltage drop V32 across the voltage divider. The control connection of the drive transistor 41 is connected to the center tap of the voltage divider 32. In this circuit, the drive transistor 41 is not switched on until the voltage drop across the voltage divider 32 has risen sufficiently that the voltage at the center tap of the voltage divider 32 corresponds to the threshold voltage of the drive transistor 41. The voltage $V_{ESD}$ can rise to this threshold value, when the discharge MOSFET 2 has already previously been switched on, when electrical charge is supplied to the first circuit node 11 more quickly than it is dissipated first of all via the discharge MOSFET 2. This means that the first threshold value Vth1, at which switching takes place from the first trigger voltage V1 to the second trigger voltage V2, may even be above the first trigger voltage V1.

Figure 6:
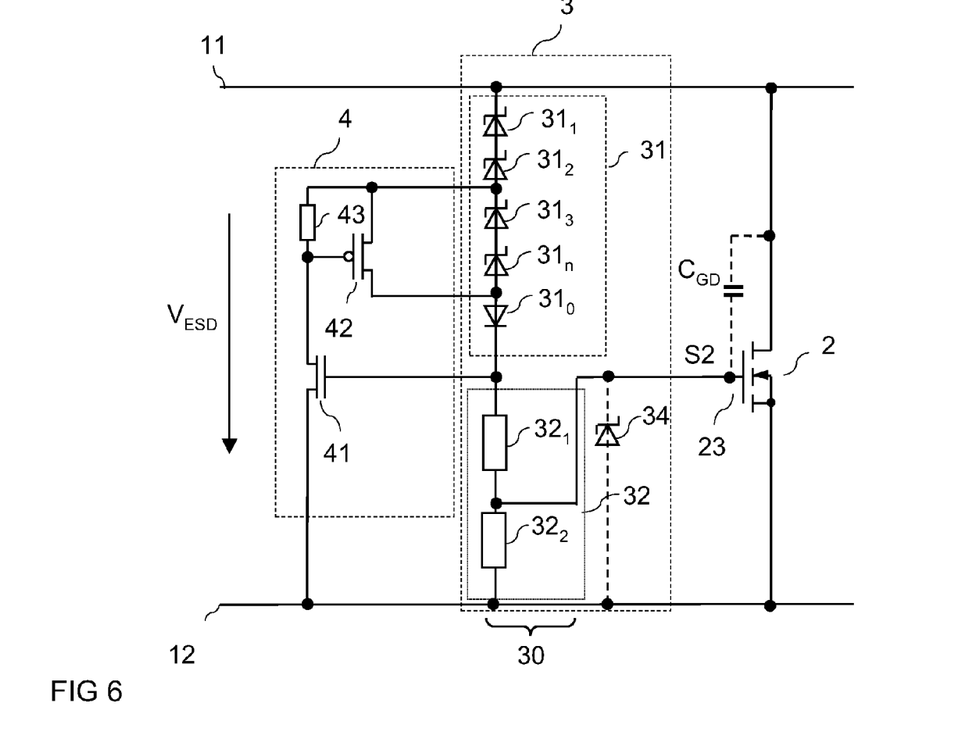
FIG. 6 illustrates a third exemplary embodiment of the protection circuit shown in FIG. 3.

FIG. 6 shows a further exemplary embodiment of a protection circuit as shown in FIG. 3. This protection circuit differs from that illustrated in FIG. 4 in that the threshold value of the voltage $V_{ESD}$, at which switching takes place from the first trigger value V1 to the second trigger value V2, is below the threshold value of the circuit shown in FIG. 4. In the illustrated protection circuit, this is achieved by the discharge MOSFET 2 being driven via the voltage divider 32 with the first and the second voltage divider resistances $32_1$, $32_2$. The drive connection 23 of the discharge MOSFET 2 is in this case connected to the center tap of the voltage divider 32. In this case, the discharge MOSFET 2 is not switched on until the voltage at the center tap of the voltage divider 32 corresponds to its threshold voltage, that is to say when the voltage V32 across the voltage divider 32 is:

$$V32_{th} = \frac{R32_1 + R32_2}{R32_2} \cdot V_{th}. \tag{1}$$

R32$_1$ and R32$_2$ in this case denote the resistance values of the voltage divider resistances 32$_1$, 32$_2$, and V$_{th}$ denotes the threshold voltage of the discharge MOSFET 2.

In this protection circuit, the first trigger value V1 therefore corresponds to the sum of the breakdown voltages of the zener diodes 31$_1$-31$_n$, the forward-biased voltage of the diode 31$_0$ and the voltage V32$_{th}$ in accordance with equation (1).

In the circuit shown in FIG. 6, switching has already taken place to the lower, second trigger value, when the voltage V32 across the voltage divider 32 corresponds to the threshold voltage of the drive transistor 41 in the setting circuit 4, since, in this circuit, the drive transistor 41 is driven directly by the voltage V32 across the voltage divider 32. The threshold value Vth1 of the voltage V$_{ESD}$ at which switching takes place to the second trigger value V2 therefore corresponds to the sum of the breakdown voltage of the zener diodes 31$_1$-31$_n$, the forward-biased voltage of the diode 31$_0$ and the threshold voltage of the drive transistor 41. The second trigger value V2 corresponds to the sum of the zener voltages of the zener diodes 31$_1$, 31$_2$, the forward-biased voltage of the diode 31$_0$ and the voltage V32$_{th}$ in accordance with equation (1).

The voltage V32 across the resistance element 32 (cf. FIG. 4) or the voltage divider 32 (cf. FIGS. 5 and 6) represents a trigger signal which is used to switch the discharge MOSFET 2 on or off. In the circuits shown in FIGS. 4 and 5, the trigger signal drives the discharge MOSFET 2 directly, and in the circuit shown in FIG. 6, it drives it via the center tap of the voltage divider 32.

If the discharge MOSFET 2 and the selection transistor 41 in the circuits shown in FIGS. 4, 5 and 6 are designed to have the same threshold voltages, then the two transistors 2, 41 are driven at the same time when the voltage V$_{ESD}$ rises in the circuit shown in FIG. 4, that is to say the first threshold value Vth1 corresponds to the first trigger voltage V1. In the circuit shown in FIG. 5, the discharge MOSFET 2 is driven before the selection transistor 41, that is to say the first threshold value Vth1 is above the first trigger voltage V1; and in the circuit shown in FIG. 6, the discharge MOSFET 2 is driven after the selection transistor 41, that is to say the first threshold voltage is below the first trigger voltage V1.

However, in the circuit shown in FIG. 4, as well, the two transistors 2, 41 can be switched on at different times when the voltage V$_{ESD}$ rises, to be precise by the two transistors 2, 41 having different threshold voltages. In this case, that one of the two transistors which has the lower threshold voltage is switched on first. On the other hand, even when the two transistors 2, 41 have different threshold voltages, they can be switched on at the same time, to be precise by additionally using a voltage divider as shown in either of FIGS. 5 and 6. In other words: the first threshold value Vth1 and the first trigger voltage V1 can be matched to one another as required by suitable choice of the threshold voltages of the transistors and/or by use of the voltage divider 32 for driving the discharge MOSFET 2 and the selection transistor 41.

The statements above relating to the drive of the discharge MOSFET relate to steady-state operation, that is to say operation in which the discharge MOSFET 2 is driven exclusively as a function of an amplitude of the voltage V$_{ESD}$ between the circuit nodes. In this context, it should be noted that the discharge MOSFET may in some cases already have been switched on when the voltage V$_{ESD}$ changes very quickly, even before the trigger value is reached. This is because of a gate-drain capacitance C$_{GD}$, which is unavoidable in the discharge MOSFET (shown by dashed lines in FIGS. 3 to 6) and switches the MOSFET 2 on when the voltage V$_{ESD}$ across the load path of said MOSFET 2 changes quickly, and the effective impedance between the gate and the source of the discharge MOSFET 2. However, this does not influence the trigger values that are used to drive the discharge MOSFET 2 via the trigger circuit 3.

Figure 7:
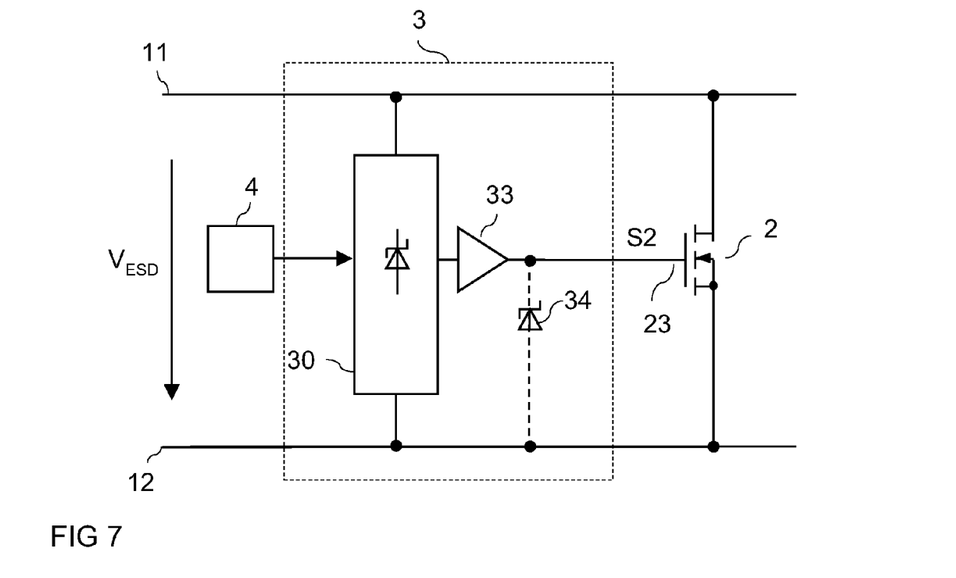
FIG. 7 illustrates one example of the protection circuit as shown in FIG. 1, in which the trigger circuit has an amplifier.

FIG. 7 shows a further example of a protection circuit as shown in FIG. 1. In this protection circuit, the trigger circuit 3 has a detector circuit 30 and an amplifier 33, with the amplifier 33 being connected between the detector circuit 30 and the drive connection 23 of the discharge element 2. In the illustrated example—as in the case of the examples shown in FIGS. 4 to 6 as well—the discharge element is in the form of an n-MOSFET.

Figure 8:
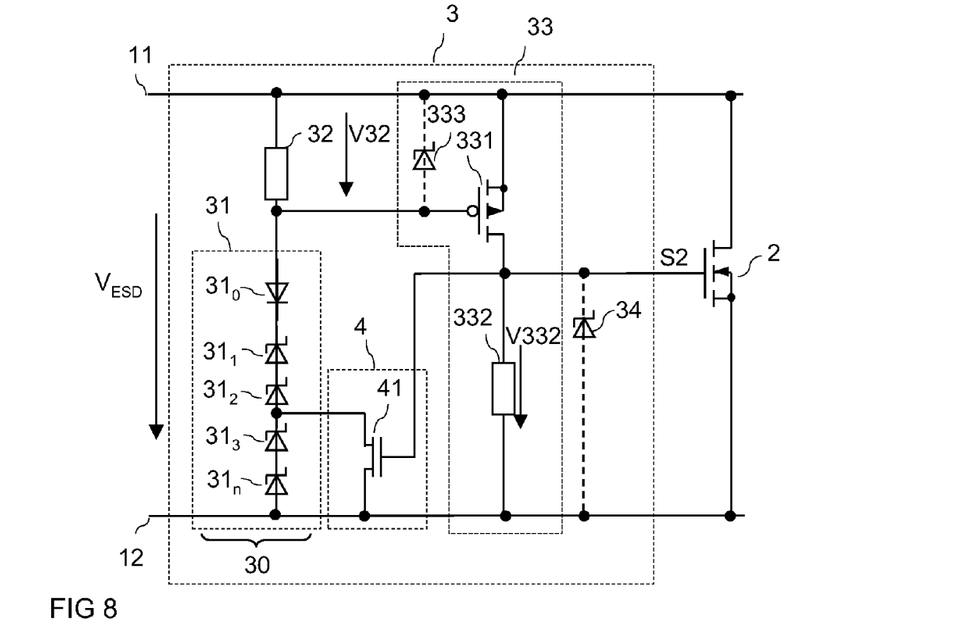
FIG. 8 illustrates a first exemplary embodiment of the protection circuit shown in FIG. 7.

FIG. 8 shows a first exemplary embodiment of the protection circuit illustrated in FIG. 7. The protection circuit shown in FIG. 8 has a detector circuit 30 with a zener circuit 31 and a resistance element 32 connected in series. By way of example, the resistance element 32 is a non-reactive resistor. By way of example, the zener circuit 31 has a plurality of zener diodes 31$_1$-31$_n$ which are connected in the reverse-biased direction between the first and the second circuit nodes 11, 12. In a corresponding manner to the statements that have already been made, the number n of zener diodes in the zener circuit 31 may be chosen as required. The zener circuit 31 furthermore optionally has a diode 31$_0$ which is connected back-to-back in series with the zener diodes, and in this case it would also be possible to provide diodes such as these connected in series. In the protection circuit illustrated in FIG. 8, a voltage V32 across the resistance element 32 does not directly drive the discharge MOSFET 2—in contrast to the exemplary embodiments which have already been explained. This voltage V32 represents a trigger signal which the amplifier stage 33 uses to produce the drive signal S2 for the discharge MOSFET 2.

In principle, the amplifier stage 33 may be of any desired form. In the illustrated example, the amplifier stage 33 has a transistor 331 which is driven by the trigger signal, that is to say the voltage across the resistance element 32. In the illustrated example, this transistor 331 is a p-MOSFET, whose gate-source path is connected in parallel with the resistance element 32. This transistor 331 is switched on when the voltage drop across the resistance element 32 reaches the value of its threshold voltage. A resistance element 332 is connected in series with the load path (drain-source path). A voltage drop V332 across this resistance element forms the drive signal S2 for the discharge MOSFET 2.

In contrast to the exemplary embodiments shown in FIGS. 4 to 6, the discharge MOSFET 2 in the protection circuit illustrated in FIG. 8 is not driven directly via the detector circuit 30 but via the amplifier 33, as a result of which the discharge MOSFET 2 is switched on more quickly when the voltage V$_{ESD}$ reaches the trigger voltage. Speeding up the drive process is justified in particular because the gate-source capacitance (not illustrated) of the discharge MOSFET 2 must be charged in order to switch it on. This capacitance can be charged more quickly via the amplifier 33 than via the detector circuit 30 in the previously explained exemplary embodiment. Furthermore, a higher gate-source voltage can be achieved on the discharge MOSFET 2.

In the protection circuit illustrated in FIG. 8, the trigger voltage is in principle set in the same manner as in the case of the protection circuit shown in FIG. 4, depending on the drive signal S2. In the protection circuit shown in FIG. 8, the drive signal S2 is, however, no longer dependent only on the voltage V$_{ESD}$ between the first and the second circuit nodes 11, 12, but also on the switched-on resistance of the transistor 331 in the amplifier 33. In the protection circuit illustrated in FIG. 8, the trigger voltage changes from the first trigger value to the second trigger value when the drive signal S2 reaches the value of the threshold voltage of the selection transistor 41 in the setting circuit 4. In the circuit shown in FIG. 8, the drive transistor 41 is used to directly bridge some of the zener diodes—specifically the zener diodes $31_3$, $31_n$ in the example. The load path of this transistor is for this purpose connected in parallel with the zener diodes $31_3$, $31_n$ to be bridged, between a circuit node which is common to the two zener diodes $31_2$, $31_3$, and the second circuit node 12. The second trigger value corresponds to the sum of the breakdown voltages of the zener diodes $31_1$, $31_2$, the forward-biased voltage of the diode $31_0$ and the threshold voltage of the transistor 331 in the amplifier circuit 33. The threshold value at which switching takes place between the first and the second trigger value is substantially dependent in the circuit shown in FIG. 8 on the drive signal S2, which is in turn dependent on the voltage $V_{ESD}$ and the zener circuit 31. In the circuit shown in FIG. 8, switching between the trigger values results essentially in charge equalization taking place between the first and the second circuit nodes 11, 12 until the voltage $V_{ESD}$ has fallen below the second trigger value. Furthermore, the discharge MOSFET 2 is also driven to have an even lower impedance.

Figure 9:
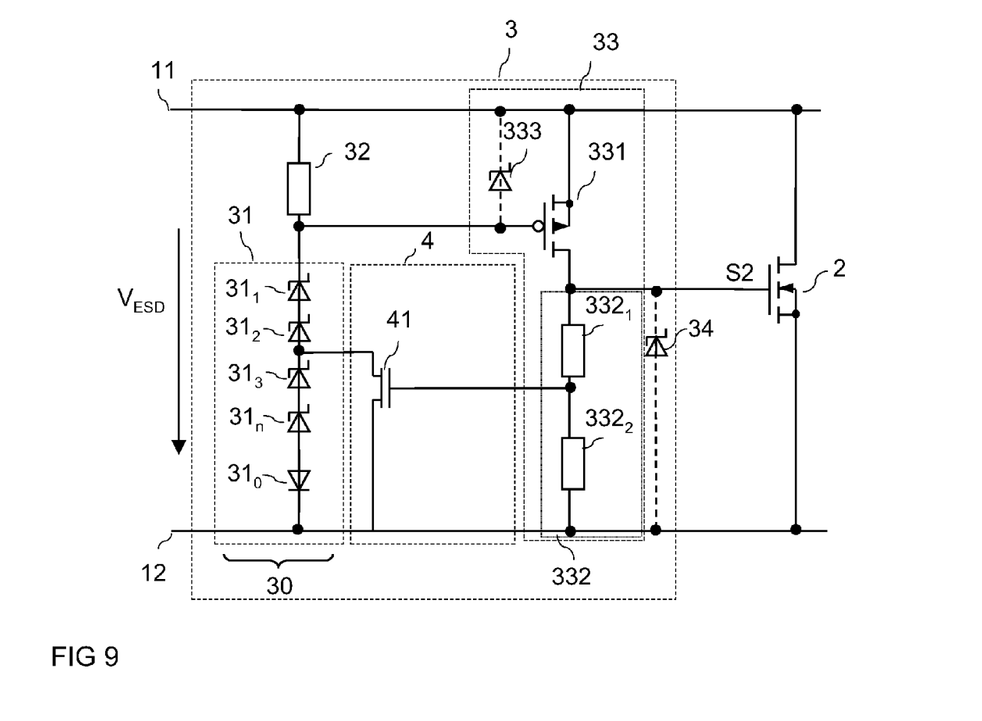
FIG. 9 illustrates a second exemplary embodiment of the protection circuit shown in FIG. 7.

In the protection circuit shown in FIG. 8, switching between the two trigger values (from V1 to V2) takes place when the drive signal S2 reaches the value of the threshold voltage of the drive transistor 41. FIG. 9 shows a protection circuit which has been modified from that illustrated in FIG. 8 in that switching from the first trigger value V1 to the second trigger value V2 takes place only when the drive signal S2 has risen to a value which is above the threshold voltage of the drive transistor 41. This means that the drive transistor 41 in the setting circuit 4 is driven by a voltage divider 332 with voltage divider resistances $332_1$, $332_2$, and with the voltage divider being connected in series with the transistor 331 in the amplifier stage 33. The drive transistor 41 is connected to the center tap of the voltage divider 332. Switching takes place when the drive signal S2, which corresponds to the voltage V332, has risen to a value $V332_{th}$, for which:

$$V332_{th} = \frac{R332_1 + R332_2}{R332_2} \cdot V_{th}. \quad (2)$$

In this case, $R332_1$, $R332_2$ denote the resistance values of the voltage divider resistances $332_1$, $332_2$, and $V_{th}$ denotes the threshold voltage of the drive transistor 41.

Figure 10:
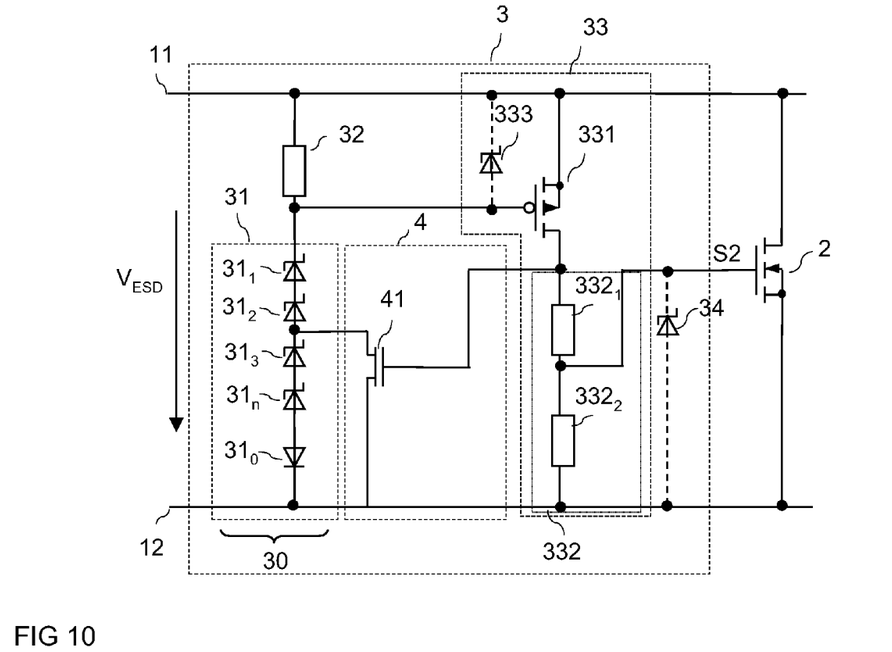
FIG. 10 illustrates a third exemplary embodiment of the protection circuit shown in FIG. 7.

FIG. 10 shows a further exemplary embodiment of a protection circuit as shown in FIG. 7. This protection circuit differs from that illustrated in FIG. 8 in that the discharge MOSFET 2 is driven via the voltage divider with the voltage divider resistances $332_1$, $332_2$. By way of example, this makes it possible for switching from the first trigger value to the second trigger value to take place even before the drive signal S2 has reached the value of the threshold voltage of the discharge MOSFET 2. The drive connection 23 of the discharge MOSFET 2 is connected to the center tap of the voltage divider.

Instead of having to provide a voltage divider, such as the voltage divider 32 in FIGS. 5 and 6 or the voltage divider 332 in FIGS. 9 and 10, the discharge MOSFET 2 and the transistor 41 in the bridging circuit 4 can also be implemented such that they have different threshold voltages, in order to ensure that these transistors are switched on at different values of the drive signal S2. The transistors 2 and 41 are in this case driven by the drive signal S2 from the discharge MOSFET 2, but are switched on at different values of the drive signal S2.

Figure 11:
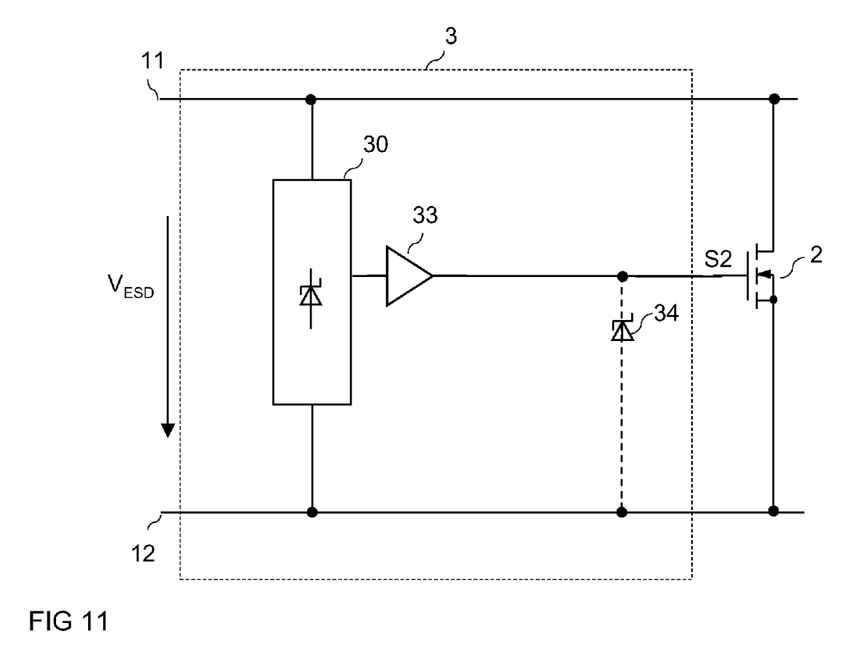
FIG. 11 illustrates a second exemplary embodiment of a protection circuit, which has a discharge element and a trigger circuit with a zener circuit and an amplifier.

FIG. 11 shows a further exemplary embodiment of a protection circuit. This protection circuit corresponds to the protection circuit illustrated in FIG. 7, with the difference that no setting circuit is provided. The statements made in conjunction with FIG. 7 relating to all the components of the protection circuit, with the exception of the setting circuit 4, therefore apply in a corresponding manner to the protection circuit shown in FIG. 11.

Figure 12:
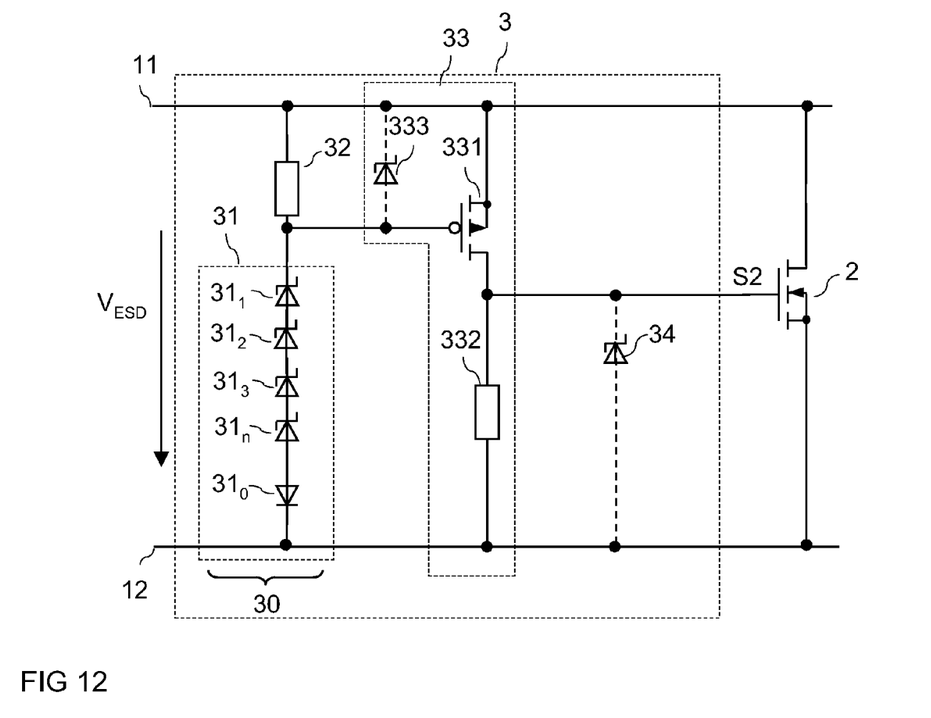
FIG. 12 illustrates a first exemplary embodiment of the protection circuit shown in FIG. 11.

FIG. 12 shows a first exemplary embodiment of the protection circuit as shown in FIG. 11. In this protection circuit, the detector circuit 30 has a zener circuit 31 and a resistance element 32 connected in series, between the first and the second circuit nodes 11, 12. This detector circuit 30 is implemented in a corresponding manner to the detector circuit shown in FIG. 10, as a result of which the statements made in conjunction with FIG. 10 apply in a corresponding manner. The amplifier 33 in the circuit shown in FIG. 12 is implemented in a corresponding manner to the amplifier 33 in the protection circuit in FIG. 10, as a result of which the statements made in conjunction with FIG. 10 likewise apply in a corresponding manner. The reference symbol 333 denotes an optional protection element, in the illustrated case a zener diode, for the amplifier transistor 331. This zener diode is connected between the gate connection and the source connection of the amplifier transistor 331 such that the drive voltage or gate-source voltage of the transistor is limited to the value of the breakdown voltage of this zener diode 333. It is, of course, also possible to provide a plurality of zener diodes connected in series, instead of a single zener diode.

In the protection circuit illustrated in FIG. 12, the discharge MOSFET 2 is switched on via the trigger circuit 3 when the voltage $V_{ESD}$ between the first and the second circuit nodes 11, 12 rises to a value which corresponds to the sum of the breakdown voltages of the zener diodes $31_1$-$31_n$ of the zener circuit 30 and the threshold voltage of the amplifier transistor 331. The discharge MOSFET 2 is switched on quickly and reliably via the amplifier 3, thus ensuring efficient charge equalization between the first and the second circuit nodes 11, 12.

Figure 13:
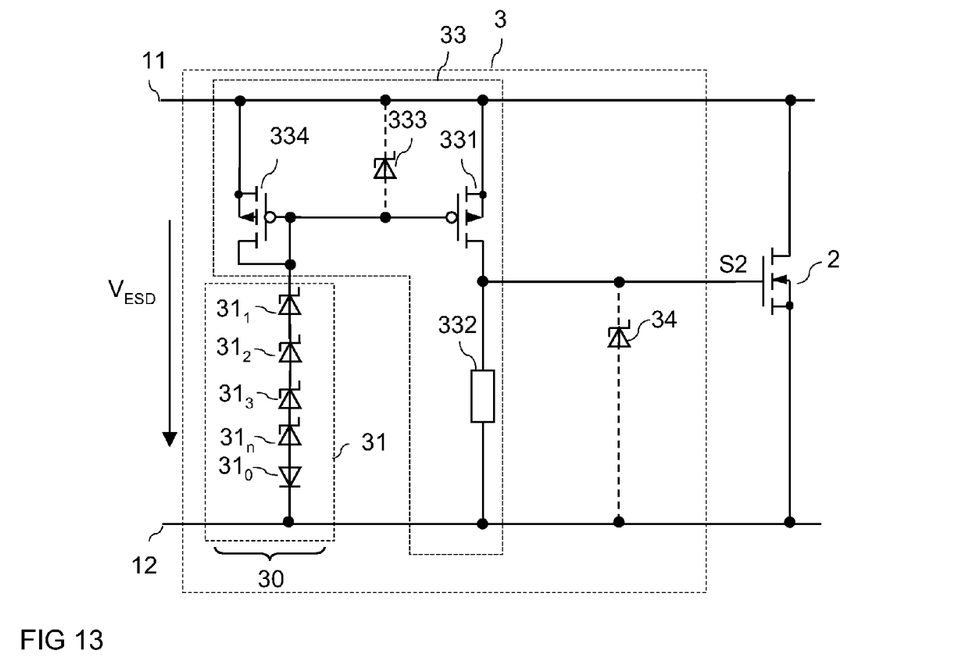
FIG. 13 illustrates a second exemplary embodiment of the protection circuit shown in FIG. 11.

FIG. 13 shows a further exemplary embodiment of a protection circuit as shown in FIG. 11. The protection circuit shown in FIG. 13 differs from that illustrated in FIG. 12 in that the detector circuit 30 has a transistor 334 connected as a diode, as the detector element, instead of a resistance element 32. The transistor 334 connected as a diode is connected in series with the zener circuit 30 between the first and the second circuit nodes 11, 12.

The transistor 334 connected as a diode, together with the amplifier transistor 331, forms a current mirror. If the voltage $V_{ESD}$ between the two circuit nodes 11, 12 in this circuit rises above a value which corresponds to the sum of the breakdown voltages of the zener diodes $31_1$-$31_n$ of the zener circuit 31, that is to say the breakdown voltage of the zener circuit 31, and corresponds to the threshold voltage of the transistor 334 connected as a diode, then a current flows through the transistor 334 connected as a diode. A current flowing through the amplifier transistor 331 is proportional to the current through the transistor 334 connected as a diode, with the proportionality factor being defined by the ratio of the area between the amplifier transistor 331 and the transistor 334 connected as a diode. By way of example, the transfer function of the current mirror is 1:k, where, when k>1, a current flowing through the amplifier transistor 331 is greater than a current through the transistor 334 connected as a diode. In this case, because of the presence of the amplifier 33, the discharge MOSFET 2 can be switched on more quickly than would be the case if only the detector circuit 30 were present.

Figure 14:
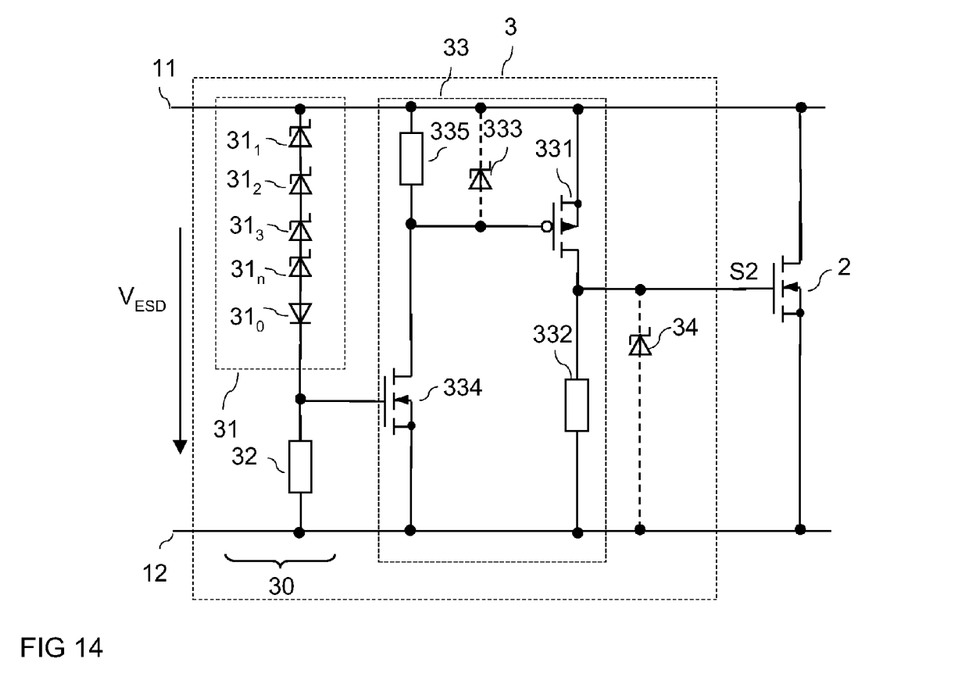
FIG. 14 illustrates one exemplary embodiment of the protection circuit shown in FIG. 11.

FIG. 14 shows a further exemplary embodiment of a protection circuit as shown in FIG. 11. This protection circuit differs from that illustrated in FIG. 12 in that the resistance element 32 is connected between the zener circuit 31 and the second circuit node 12. In this case, the amplifier 33 comprises two amplifier transistors: the amplifier transistor 331 already explained with reference to FIG. 12 and connected in series with a resistance element 332 between the two circuit nodes 11, 12, and a further amplifier transistor 334 which drives the first amplifier transistor 331. This further amplifier transistor 334 is driven by the voltage V32 across the resistance element 32 in the detector circuit 30. The load path of this further amplifier transistor 334 is connected in series with a further resistance element 335 between the first and the second circuit nodes 11, 12. A voltage across this further resistance element 335 drives the first amplifier transistor 331.

The amplifier 33 shown in FIG. 14 could be combined in a simple manner with the switchable protection circuit illustrated in FIG. 6, in order to achieve a protection circuit— corresponding to the protection circuits in FIGS. 8 to 10—in which it is not only possible to switch between two trigger values, but in which the discharge MOSFET is also driven via an amplifier.

Figure 15:
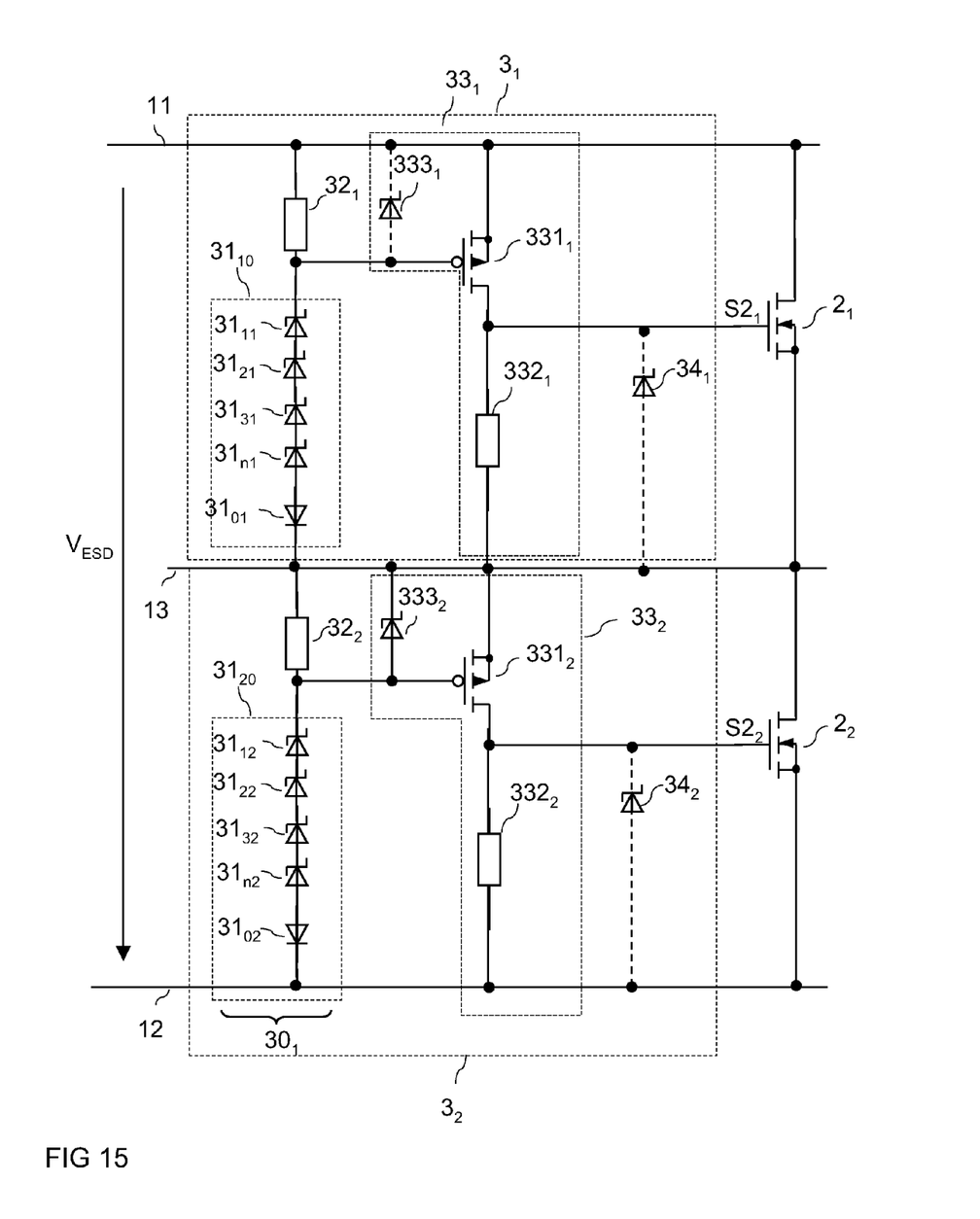
FIG. 15 illustrates a fourth exemplary embodiment of a protection circuit, which has a discharge element and a trigger circuit with a zener circuit and an amplifier.

FIG. 15 shows a further exemplary embodiment of a protection circuit. This protection circuit comprises two cascaded protection circuit units, one of which is connected between the first circuit node 11 and an intermediate node 13, and another of which is connected between the intermediate node 13 and the second circuit node 12. In the illustrated example, each of these protection circuit units is implemented in a corresponding manner to the protection circuit shown in FIG. 12, that is to say it comprises a discharge element $2_1$, $2_2$, in the illustrated example a discharge MOSFET, a trigger circuit $3_1$, $3_2$ for driving the discharge MOSFET. In FIGS. 12 and 15, the same circuit components are in each case annotated with the same reference symbols, with the components in the first protection unit being identified by a subscript index "1", and the components in the second protection circuit unit being identified by a subscript index "2". The implementation of the two protection circuit units in the same manner as the protection circuit shown in FIG. 12 should be understood to be only an example. In principle, the two protection circuit units can be implemented in a corresponding manner to any of the previously explained protection circuits. In this context, it is also possible to implement the two protection circuit units in different ways, that is to say with the first protection circuit unit corresponding to the first of the protection circuits explained above, and the second protection circuit unit corresponding to the second of the protection circuits explained above. The two protection circuit units operate in a corresponding manner to the protection circuits used for their implementation. In this context, it should be noted that more than two protection circuit units, which can each be implemented in a corresponding manner to one of the protection circuits explained with reference to FIGS. 1 to 14, are also cascaded.

Finally, it should be noted that features which have been explained in conjunction with an exemplary embodiment can also be combined with features of other exemplary embodiments, if this has not already been explicitly explained, except when such a combination is mutually exclusive.

What is claimed is:

1. A protection circuit comprising:
   a controllable discharge transistor having a load path coupled between a first circuit node and a second circuit node and having an on state or an off state, wherein the discharge transistor provides a discharge path between the first and the second circuit nodes when the discharge transistor is in the on state;
   a trigger circuit having a first connection coupled to the first circuit node and a second connection coupled to the second circuit node, wherein:
      the trigger circuit comprises series connected elements coupled between the first and second connections,
      the trigger circuit has a third connection from an intermediate node of the series connected elements that is directly connected to a control terminal of the discharge transistor,
      the trigger circuit is configured to supply a drive signal to the control terminal of the discharge transistor, and
      the drive signal is operable to switch the discharge transistor to the on state when the voltage between the first and the second circuit nodes reaches a trigger value; and
   a setting circuit coupled to the trigger circuit, the setting circuit configured to change the trigger value from a first trigger value to a second trigger value depending on at least one of a voltage between the first and the second circuit nodes and the drive signal, wherein the second trigger value is less than the first trigger value.

2. The protection circuit as claimed in claim 1, wherein the setting circuit is configured to reduce the trigger value from the first trigger value to the second trigger value when the voltage between the first and the second circuit nodes exceeds a threshold value.

3. The protection circuit as claimed in claim 2, wherein the threshold value corresponds to the first trigger value.

4. The protection circuit as claimed in claim 2, wherein the threshold value is higher than the first trigger value.

5. The protection circuit as claimed in claim 2, wherein the threshold value is lower than the first trigger value.

6. The protection circuit as claimed in claim 1, wherein the setting circuit is configured to produce the trigger value depending on the drive signal.

7. The protection circuit as claimed in claim 6, wherein the setting circuit is configured to reduce the trigger value from the first trigger value to the second trigger value when the drive signal exceeds a threshold value.

8. The protection circuit as claimed in claim 7, wherein the threshold value corresponds to a threshold voltage of the transistor.

9. The protection circuit as claimed in claim 7, wherein the threshold value is higher than a threshold voltage of the transistor.

10. The protection circuit as claimed in claim 7, wherein the threshold value is lower than a threshold voltage of the transistor.

11. The protection circuit as claimed in claim 1, wherein the series connected elements comprise a detector circuit coupled between the first and the second circuit nodes, the detector circuit configured to produce a trigger signal depending on the voltage between the first and the second circuit nodes, wherein the drive signal is dependent on the trigger signal.

12. The protection circuit as claimed in claim 11, wherein the detector circuit comprises:
   a zener circuit having at least one zener diode; and
   a detector element coupled in series with the zener circuit.

13. The protection circuit as claimed in claim 12, wherein the detector element comprises a resistance element, a voltage divider, or a diode.

14. The protection circuit as claimed in claim 12, wherein the trigger signal is a voltage across the detector element.

15. The protection circuit as claimed in claim 12, wherein the zener circuit comprises a plurality of zener diodes coupled in series between the first and the second circuit nodes.

16. The protection circuit as claimed in claim 15, wherein the setting circuit comprises a bridging circuit that is configured to bridge at least one of the zener diodes in order to set the second trigger value.

17. The protection circuit as claimed in claim 16, wherein the bridging circuit comprises a switching element coupled in parallel with at least one zener diode of the zener circuit.

18. The protection circuit as claimed in claim 16, wherein the bridge circuit is configured to bridge at least one zener diode of the zener circuit depending on the drive signal.

19. The protection circuit as claimed in claim 14, wherein the trigger circuit comprises an amplifier coupled between the detector circuit and the discharge transistor, wherein the trigger signal is supplied to the amplifier and the amplifier produces the drive signal depending on the trigger signal.

20. The protection circuit as claimed in claim 1, wherein the discharge transistor comprises a plurality of transistors.

21. A protection circuit comprising:
a controllable discharge element having a load path coupled between a first circuit node and a second circuit node, the discharge element configured to assume an on state or an off state, wherein the discharge element provides a discharge path between the first and the second circuit nodes when the discharge element is in the on state; and
a trigger circuit having a first connection coupled to the first circuit node and a second connection coupled to the second circuit node, the trigger circuit configured to produce a drive signal that switches the discharge element to the on state when a voltage between the first and the second circuit nodes reaches a trigger voltage, the trigger circuit comprising:
 a detector circuit coupled between the first and the second circuit nodes and configured to produce a trigger signal depending on the voltage between the first and the second circuit nodes, the detector circuit comprising a zener circuit having a plurality of series connected zener diodes and a bypass circuit configured to bypass a portion of the series connected zener diodes when the bypass circuit is turned on; and
 an amplifier coupled between the detector circuit and the discharge element, wherein the trigger signal is supplied to the amplifier and the amplifier produces the drive signal depending on the trigger signal.

22. The protection circuit as claimed in claim 21, wherein the detector circuit further comprises a detector element coupled in series with the zener circuit.

23. The protection circuit as claimed in claim 22, wherein the trigger signal is a voltage across the detector element.

24. The protection circuit as claimed in claim 23, wherein the amplifier comprises at least one transistor that is coupled to the detector element.

25. A protection circuit comprising:
a controllable discharge element having a load path coupled between a first circuit node and a second circuit node and having an on state or an off state, wherein the discharge element provides a discharge path between the first and the second circuit nodes when the discharge element is in the on state;
a trigger circuit having first connection coupled to the first circuit node and a second connection coupled to the second circuit node, the trigger circuit configured to produce a drive signal that switches the discharge element to the on state when the voltage between the first and the second circuit nodes reaches a trigger value;
a setting circuit coupled to the trigger circuit, the setting circuit configured to change the trigger value from a first trigger value to a second trigger value depending on at least one of a voltage between the first and the second circuit nodes and the drive signal, wherein the second trigger value is less than the first trigger value, and wherein the setting circuit is configured to:
 produce the trigger value depending on the drive signal; and
 reduce the trigger value from the first trigger value to the second trigger value when the drive signal exceeds a threshold value; and
wherein the controllable discharge element comprises a transistor and wherein the threshold value is lower than a threshold voltage of the transistor.

\* \* \* \* \*